United States Patent
Zhang et al.

(10) Patent No.: US 8,883,525 B2
(45) Date of Patent: *Nov. 11, 2014

(54) WHITE LIGHT EMITTING DIODE (LED) LIGHTING DEVICE DRIVEN BY PULSE CURRENT

(71) Applicant: Sichuan Sunfor Light Co., Ltd., Sichuan (CN)

(72) Inventors: Ming Zhang, Chengdu (CN); Kun Zhao, Chengdu (CN); Dong-ming Li, Chengdu (CN)

(73) Assignee: Sichuan Sunfor Light Co., Ltd., Sichuan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/107,346

(22) Filed: Dec. 16, 2013

(65) Prior Publication Data

US 2014/0134764 A1    May 15, 2014

Related U.S. Application Data

(63) Continuation of application No. 13/583,464, filed as application No. PCT/CN2010/075145 on Jul. 14, 2010, now Pat. No. 8,637,874.

(30) Foreign Application Priority Data

Mar. 12, 2010    (CN) .......................... 2010 1 0123249
Jun. 23, 2010    (CN) .......................... 2010 1 0206904

(51) Int. Cl.
  *H01L 21/00*    (2006.01)
  *C09K 11/74*    (2006.01)
  *H05B 33/08*    (2006.01)
  *H01L 33/50*    (2010.01)
  *C09K 11/58*    (2006.01)
  *C09K 11/77*    (2006.01)
  *H05B 33/12*    (2006.01)

(52) U.S. Cl.
  CPC ............ *H05B 33/12* (2013.01); *C09K 11/7421* (2013.01); *H05B 33/0815* (2013.01); *H01L 33/504* (2013.01); *C09K 11/586* (2013.01); *C09K 11/7792* (2013.01); *C09K 11/7703* (2013.01); *Y02B 20/181* (2013.01); *C09K 11/7774* (2013.01); *C09K 11/7761* (2013.01)
  USPC ........................ 438/22; 438/29; 257/E21.527

(58) Field of Classification Search
  USPC .................... 438/22, 25, 28, 29; 257/E21.527
  See application file for complete search history.

(56) References Cited

U.S. PATENT DOCUMENTS 7,489,086 B2    2/2009    Miskin et al.
8,269,410 B2    9/2012    Kijima et al.

FOREIGN PATENT DOCUMENTS

| CN | 101052254 A | 10/2007 |
| CN | 101118935 A | 2/2008 |
| CN | 100464111 C | 2/2009 |
| CN | 101705095 A | 5/2010 |

OTHER PUBLICATIONS

International Search Report in International Patent Application No. PCT/CN2010/075145, mailed Dec. 9, 2010.
File History of U.S. Appl. No. 13/583,464 (filed on Nov. 5, 2012).
File History of U.S. Appl. No. 14/107,294 (filed on Dec. 16, 2013).
File History of U.S. Appl. No. 14/107,387 (filed on Dec. 16, 2013).

*Primary Examiner* — Hoai V Pham
(74) *Attorney, Agent, or Firm* — Michael X. Ye; Andrews Kurth LLP

(57) ABSTRACT

A white LED lighting device driven by a pulse current is provided, which consists of blue, violet or ultraviolet LED chips, blue afterglow luminescence materials A and yellow luminescence materials B. Wherein the weight ratio of the blue afterglow luminescence materials A to the yellow luminescence materials B is 10-70 wt %:30-90 wt %. The white LED lighting device drives the LED chips with a pulse current having a frequency of not less than 50 Hz. Because of using the afterglow luminescence materials, the light can be sustained when an excitation light source disappears, thereby eliminating the influence of LED light output fluctuation caused by current variation on the illumination. At the same time, the pulse current can keep the LED chips being at an intermittent work state, so as to overcome the problem of chip heating.

20 Claims, 3 Drawing Sheets

WHITE LIGHT EMITTING DIODE (LED) LIGHTING DEVICE DRIVEN BY PULSE CURRENT

CROSS-REFERENCE TO RELATED APPLICATIONS

This application is a continuation application of U.S. application Ser. No. 13/583,464, filed on Nov. 5, 2012. The entirety of which is incorporated herein by reference.

FIELD

The present invention relates to a white LED lighting device using afterglow characteristic of the luminescence powder and driven by a pulse current, which belongs to the field of LED manufacturing. The present invention more particularly relates to a white LED lighting device prepared using blue afterglow luminescence materials and yellow luminescence materials.

BACKGROUND

Currently, the LED is used in the fields such as lighting, display, backlight, etc., and as the most promising lighting means of the next generation, the LED gains extensive attention with the advantages of being energy saving, durable, pollution free, etc. There are many solutions for implementing the white LED, wherein the most mature technical solution for preparing the white LED at present is to realize the white light emission using a combination of the blue LED chip and the yellow phosphor. Volume 11 page 53 of *Appl. Phys. Lett.* published in 1967 reports a luminescence material $Y_3Al_5O_{12}:Ce^{3+}$, which has a yellow luminescence with a maximum light-emitting wavelength of 550 nm and a life of less than 100 ns. Volume 64 page 417 of *Appl. Phys. A* published in 1997 reports that the white LED light emission is realized using the yellow luminescence of $Y_3Al_5O_{12}:Ce^{3+}$ and the blue gallium nitride, and such technology is the most mature technical solution for preparing the white LED at present. The existing LED chips are mainly driven by the direct current having constant magnitude and direction. But in such a mode, the LED thermal design requirement is very high, and the LED chips will be burnt out if the extra heat cannot be dissipated in time.

The Chinese patent No. CN100464111C discloses an alternating current (AC) LED lamp using LED chips of different colors connected in parallel in an AC power source. The patent mainly describes that the LED chips of different colors together form white light, and recites the specific circuit such as red, green and blue light emitting chips, without mentioning the luminescence powder. The U.S. Pat. No. 7,489,086, B2 discloses an AC LED driving apparatus and a lighting device using the same. The patent also emphasizes on the circuit structure without making an innovation report about the luminescence powder, and the conventional luminescence powder $Y_3Al_5O_{12}:Ce^{3+}$ is still employed. The inventor of the present invention researches a luminescence material $Y_2O_3.Al_2O_3.SiO_2:Ce.B.Na.P$ having the yellow long afterglow phenomenon and a white LED lighting device driven by a pulse current (the Chinese patent application No. 200910307357.3). However, the white LED lighting device using the pulse current driving mode and the afterglow characteristic of the luminescence powder to compensate the light output fluctuation in the present invention is still not reported.

SUMMARY

The objective of the present invention is to provide a white LED lighting device driven by a pulse current.

The technical solution of the present invention: blue LED chips or ultraviolet chips driven by a pulse current+blue afterglow luminescence materials A+yellow luminescence materials B. Wherein the weight ratio of the blue afterglow luminescence materials A to the yellow luminescence materials B is 10-70 wt %:30-90 wt %, and preferably 20-50 wt %:50-80 wt %. The white LED lighting device drives the LED chips with a pulse current having a frequency of not less than 50 Hz.

The present invention implements a white LED lighting device driven by a pulse current, thereby enabling the LED chips to work periodically and intermittently. Meanwhile, the luminescence powder used by the present invention has the afterglow effect, which can compensate the light output fluctuation of the lighting device caused by the periodic variation of the pulse current.

Further, the blue afterglow luminescence material A has a peak light-emitting wavelength of 440~490 nm.

Further, the blue afterglow luminescence material A is at least one of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

The yellow luminescence material B has a peak light-emitting wavelength of 520~580 nm.

Further, the yellow luminescence material B is a luminescence material having or not having the afterglow phenomenon, or a combination thereof.

Further, the yellow luminescence material B is at least one of $Y_2O_3.Al_2O_3.SiO_2$: Ce.B.Na.P, $Y_2O_2S:Mg,Ti$, $Sr_3SiO_5:Eu^{2+}, Dy^{3+}$, $Ca_2MgSi_2O_7:Eu^{2+},Dy^{3+}$, $CaS:Sm^{3+}$, YAG:Ce and TAG:Ce.

The white light emitted by the white LED lighting device of the present invention is formed of the blue light emitted by the blue afterglow luminescence powder, the yellow light emitted by the yellow luminescence powder and the light from the blue or ultraviolet LED chip under the excitation of the chip.

The above luminescence powder may also be excited by the violet and ultraviolet LED chips, thereby achieving the same effect.

The luminescence coating of the present invention may be formed by mixing the blue afterglow luminescence materials A and the yellow luminescence materials B, or coating the blue afterglow luminescence materials A on the chips and then coating the yellow luminescence materials B on the blue afterglow luminescence materials A.

The principle of the white LED lighting device driven by the pulse current in the present invention is as follows:

From the schematic diagram of the basic module of the LED lighting device as shown in FIG. 1, it can be seen that due to the pulse periodic characteristic of the pulse current, the luminescence of the device also has a periodic bright-dark change, i.e., luminescence strobing, thereby influencing the usage of the device.

The present invention employs the luminescence materials having the afterglow characteristics so that the light will be sustained when the excitation light source disappears, thus in the white LED lighting device driven by the pulse current based on the solution of the present invention, when the current cycle is changed to the small current stage, the blue afterglow material will emit the blue afterglow to compensate the blue light and excite the yellow luminescence powder, thereby eliminating the influence of the luminescence strobing of the LED chip caused by the pulse current fluctuation, so that the light output of the device during the pulse cycle is kept stable. In addition, since the LED chip does not work in a half of each pulse cycle, the thermal effect decreases, which is beneficial to overcome the series of difficulties caused by chip heating in the usage of the existing white LED lighting device. Moreover, the white LED lighting device driven by the pulse current in the present invention achieves a good heat dispersion and a long service life without using any complex circuit switching device, which obviously reduces the cost.

BRIEF DESCRIPTION OF THE DRAWINGS

FIGS. 5-1 and 5-2 are schematic diagrams of the structure of an LED luminescence unit, in FIG. 5-1, 1 denotes a mixed luminescence coating made of blue afterglow luminescence materials A and yellow luminescence materials B; 2 denotes a blue, violet or ultraviolet LED chip; and 3 denotes a lens; and in FIG. 5-2, 2 denotes a blue, violet or ultraviolet LED chip; 3 denotes a lens; 5 denotes a coating made of blue afterglow luminescence materials A; and 4 denotes a coating made of yellow luminescence materials B.

Figure 1:
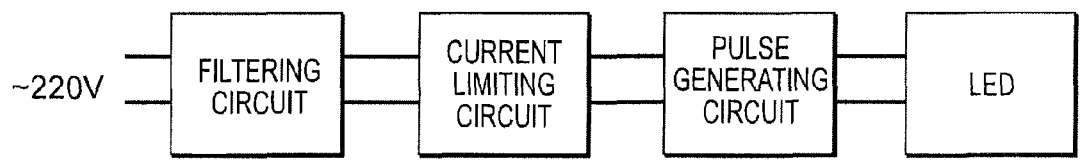
FIG. 1 is a schematic diagram of a basic LED lighting device driven by a pulse current.
Figure 2:
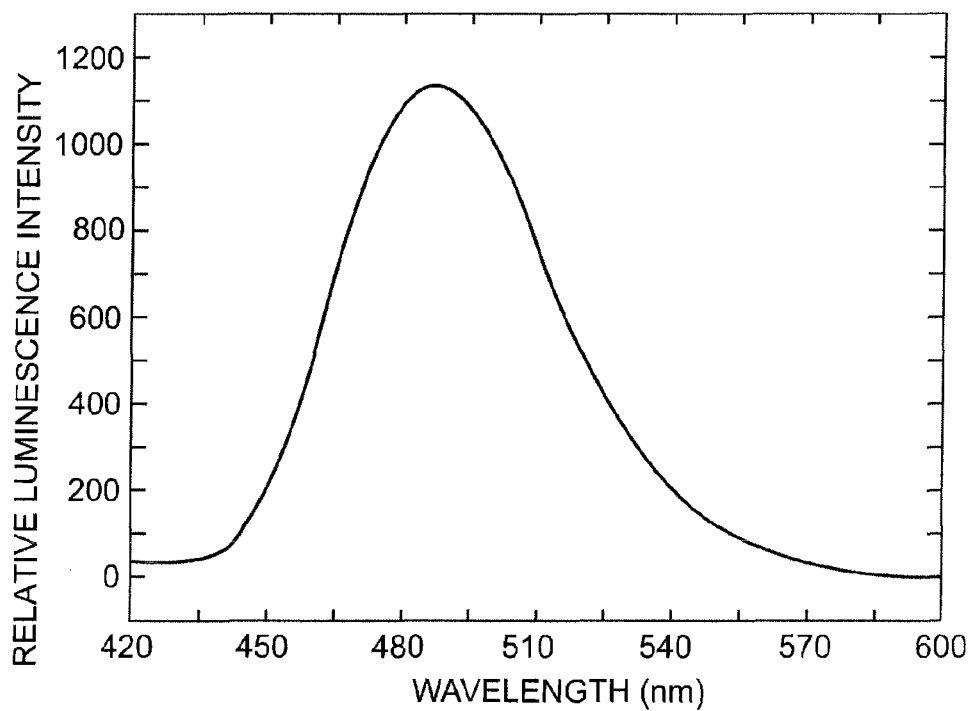
FIG. 2 is an afterglow spectrum of $Sr_4Al_{14}O_{25}:Eu^{2+},Dy^{3+}$.
Figure 3:
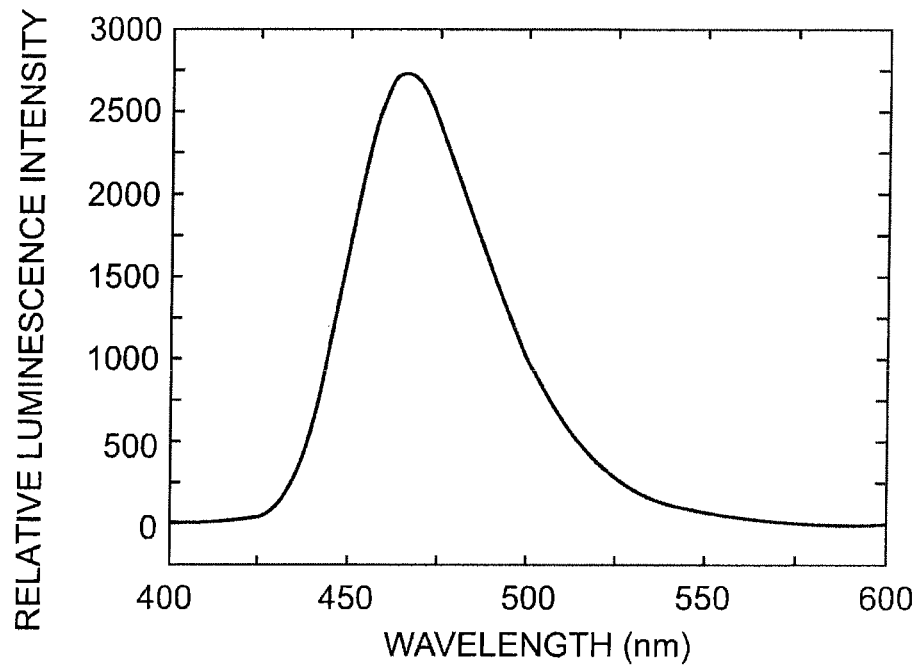
FIG. 3 is an afterglow spectrum of $Sr_2MgSi_2O_7:Eu^{2+},Dy^{3+}$.
Figure 4:
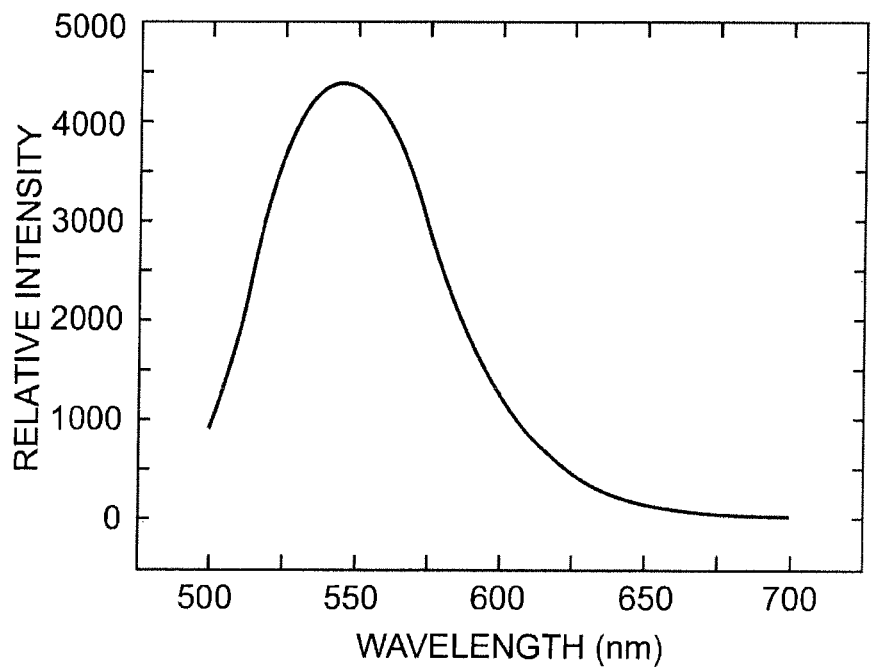
FIG. 4 is a photoluminescence spectrum of $Y_2O_3 \cdot Al_2O_3 \cdot SiO_2:Ce.B.Na.P$.
Figures 1, 5:
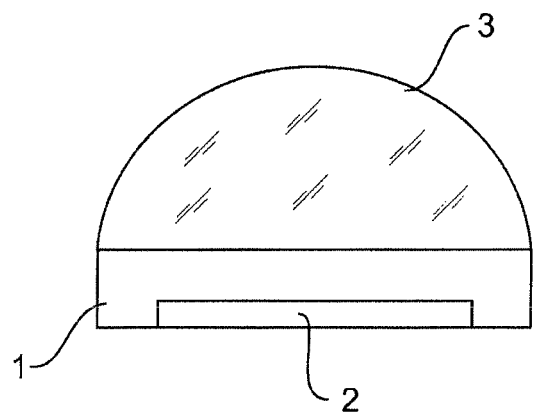
Figures 2, 5:
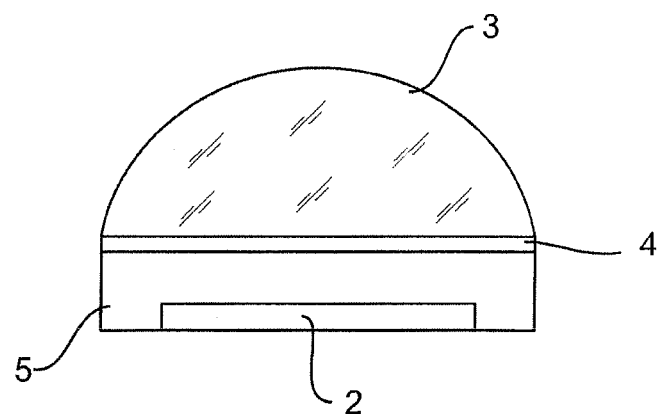

The above contents of the present invention are further described in details through the following embodiments in the form of examples. But it shall be appreciated that the subject scope of the present invention is not limited to the following examples, and any technology implemented by the above contents of the present invention shall fall within the scope of the present invention. In the examples, the pulse current has a frequency of 100 Hz, the blue LED chip has an emission wavelength of 460 nm, the violet LED chip has an emission wavelength of 400 nm, and the ultraviolet LED chip has an emission wavelength of 365 nm.

DETAILED DESCRIPTION OF THE PREFERRED EMBODIMENTS

A new white LED lighting device consists of blue LED chips, blue afterglow luminescence materials A and yellow luminescence materials B. Wherein the weight ratio of the blue afterglow luminescence materials A to the yellow luminescence materials B is 10-70 wt %:30-90 wt %, and preferably 20-50 wt %:50-80 wt %. The white LED lighting device drives the LED chips with the pulse current having a frequency not less than 50 Hz.

Wherein the blue afterglow luminescence material A has a peak light-emitting wavelength of 440-490 nm, e.g., it may be one or combinations of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

The yellow luminescence material B may be a luminescence material having or not having the afterglow phenomenon, or a combination thereof, with a peak light-emitting wavelength of 520-580 nm. The luminescence material having the afterglow phenomenon includes Ce-activated $Y_2O_3 \cdot Al_2O_3 \cdot SiO_2:Ce.B.Na.P$, $Y_2O_2S:Mg,Ti$, $Sr_3SiO_5:Eu^{2+},Dy^{3+}$, $Ca_2MgSi_2O_7:Eu^{2+},Dy^{3+}$ and $CaS:Sm^{3+}$. The luminescence material not having the afterglow phenomenon includes YAG:Ce and TAG:Ce.

The white light emitted by the white LED lighting device of the present invention is formed of the blue light emitted by the blue afterglow luminescence powder, the yellow light emitted by the yellow luminescence powder and the light from the blue LED chip under the excitation of the blue LED chip.

The present invention employs the luminescence materials having the afterglow characteristics so that the light will be sustained when the excitation light source disappears, thus in the white LED lighting device driven by the pulse current based on the solution of the present invention, when the current cycle is changed, the blue afterglow material will emit the blue afterglow to compensate the blue light and excite the yellow luminescence powder, thereby eliminating the influence of the luminescence strobing of the LED chip caused by the pulse current fluctuation on the illumination, so that the light output of the device during the pulse cycle is kept stable. In addition, since the LED chip does not work in a half of each pulse current cycle, the thermal effect decreases, which is beneficial to overcome the series of difficulties caused by chip heating in the usage of the existing white LED lighting device.

The specific examples are given as follows.

EXAMPLES 1-18

| Example | LED chip | Blue afterglow luminescence material A (wt %) | Yellow luminescence material B (wt %) |
|---------|----------|-----------------------------------------------|----------------------------------------|
| 1 | Blue | 40%$Sr_4Al_{14}O_{25}$: $Eu^{2+},Dy^{3+}$ | 60%$Y_2O_3 \bullet Al_2O_3 \bullet SiO_2$: Ce•B•Na•P |
| 2 | Blue | 35%$Sr_2MgSi_2O_7$: $Eu^{2+},Dy^{3+}$ | 65%$Y_3Al_5O_{12}$: Ce |
| 3 | Blue | 10%$Sr_2MgSi_2O_7$: $Eu^{2+},Dy^{3+}$ + 30%$Sr_4Al_{14}O_{25}$: $Eu^{2+},Dy^{3+}$ | 60%$Tb_3Al_5O_{12}$: Ce |
| 4 | Blue | 5%$Sr_2MgSi_2O_7$: $Eu^{2+},Dy^{3+}$ + 30%$Sr_4Al_{14}O_{25}$: $Eu^{2+},Dy^{3+}$ + 15%CaS: $Bi^{3+},Na^+$ | 25%$Y_2O_3 \bullet Al_2O_3 \bullet SiO_2$: Ce•B•Na•P + 10%$Sr_3SiO_5$: $Eu^{2+},Dy^{3+}$ + 15%$Ca_2MgSi_2O_7$: $Eu^{2+},Dy^{3+}$ |
| 5 | Blue | 10%$Sr_2MgSi_2O_7$: $Eu^{2+},Dy^{3+}$ + 15%CaSrS: $Bi^{3+}$ + 35%$Sr_4Al_{14}O_{25}$: $Eu^{2+},Dy^{3+}$ + 5%CaS: $Bi^{3+},Na^+$ + 5%CaS: $Cu^+,Na^+$ | 5%$Y_2O_2S$: Mg,Ti + 25%$Y_2O_3 \bullet Al_2O_3 \bullet SiO_2$: Ce•B•Na•P |
| 6 | Blue | 5%$Sr_2MgSi_2O_7$: $Eu^{2+},Dy^{3+}$ + 15%CaSrS: $Bi^{3+}$ + 20%$Sr_4Al_{14}O_{25}$: $Eu^{2+},Dy^{3+}$ | 15%$Sr_3SiO_5$: $Eu^{2+},Dy^{3+}$ + 20%$Ca_2MgSi_2O_7$: $Eu^{2+},Dy^{3+}$ + 25%$Y_3Al_5O_{12}$: Ce |
| 7 | Blue | 35%CaS: $Bi^{3+},Na^+$ | 25%$Y_2O_3 \bullet Al_2O_3 \bullet SiO_2$: Ce•B•Na•P + 10%CaS: $Sm^{3+}$ + 15%$Y_2O_2S$: Mg,Ti + 5%$Sr_3SiO_5$: $Eu^{2+},Dy^{3+}$ + 10%$Ca_2MgSi_2O_7$: $Eu^{2+},Dy^{3+}$ |
| 8 | Violet | 45%$Sr_4Al_{14}O_{25}$: $Eu^{2+},Dy^{3+}$ | 55%$Y_2O_3 \bullet Al_2O_3 \bullet SiO_2$: Ce•B•Na•P |
| 9 | Violet | 40%$Sr_2MgSi_2O_7$: $Eu^{2+},Dy^{3+}$ | 60%$Y_3Al_5O_{12}$: Ce |
| 10 | Violet | 10%$Sr_2MgSi_2O_7$: $Eu^{2+},Dy^{3+}$ + 35%$Sr_4Al_{14}O_{25}$: $Eu^{2+},Dy^{3+}$ | 55%$Tb_3Al_5O_{12}$: Ce |

-continued

| Example | LED chip | Blue afterglow luminescence material A (wt %) | Yellow luminescence material B (wt %) |
|---|---|---|---|
| 11 | Violet | 5%$Sr_2MgSi_2O_7$: $Eu^{2+},Dy^{3+}$ + 25%$Sr_4Al_{14}O_{25}$: $Eu^{2+},Dy^{3+}$ + 15%CaS: $Bi^{3+},Na^+$ | 25%$Y_2O_3 \cdot Al_2O_3 \cdot SiO_2$: Ce·B·Na·P + 20%$Sr_3SiO_5$: $Eu^{2+},Dy^{3+}$ + 10%$Ca_2MgSi_2O_7$: $Eu^{2+},Dy^{3+}$ |
| 12 | Violet | 10%$Sr_2MgSi_2O_7$: $Eu^{2+},Dy^{3+}$ + 10%CaSrS: $Bi^{3+}$ + 35%$Sr_4Al_{14}O_{25}$: $Eu^{2+},Dy^{3+}$ + 5%CaS: $Bi^{3+},Na^+$ + 5%CaS: $Cu^+,Na^+$ | 10%$Y_2O_2S$: Mg,Ti + 25%$Y_2O_3 \cdot Al_2O_3 \cdot SiO_2$: Ce·B·Na·P |
| 13 | Ultraviolet | 40%$Sr_2MgSi_2O_7$: $Eu^{2+},Dy^{3+}$ | 60%$Y_3Al_5O_{12}$: Ce |
| 14 | Ultraviolet | 30%$Sr_4Al_{14}O_{25}$: $Eu^{2+},Dy^{3+}$ | 70%$Tb_3Al_5O_{12}$: Ce |
| 15 | Ultraviolet | 20%$Sr_2MgSi_2O_7$: $Eu^{2+},Dy^{3+}$ + 35%$Sr_4Al_{14}O_{25}$: $Eu^{2+},Dy^{3+}$ | 45%$Y_2O_3 \cdot Al_2O_3 \cdot SiO_2$: Ce·B·Na·P |
| 16 | Ultraviolet | 10%$Sr_2MgSi_2O_7$: $Eu^{2+},Dy^{3+}$ + 25%$Sr_4Al_{14}O_{25}$: $Eu^{2+},Dy^{3+}$ + 5%CaS: $Bi^{3+},Na^+$ | 30%$Y_2O_3 \cdot Al_2O_3 \cdot SiO_2$: Ce·B·Na·P + 15%$Sr_3SiO_5$: $Eu^{2+},Dy^{3+}$ + 15%$Ca_2MgSi_2O_7$: $Eu^{2+},Dy^{3+}$ |
| 17 | Ultraviolet | 15%$Sr_2MgSi_2O_7$: $Eu^{2+},Dy^{3+}$ + 5% CaSrS:$Bi^{3+}$ + 10%$Sr_4Al_{14}O_{25}$: $Eu^{2+},Dy^{3+}$ + 5%CaS: $Bi^{3+},Na^+$ + 5%CaS: $Cu^+,Na^+$ | 20%$Y_2O_2S$: Mg,Ti + 40%$Y_2O_3 \cdot Al_2O_3 \cdot SiO_2$: Ce·B·Na·P |
| 18 | Ultraviolet | 10%$Sr_2MgSi_2O_7$: $Eu^{2+},Dy^{3+}$ + 5%CaSrS: $Bi^{3+}$ + 35%$Sr_4Al_{14}O_{25}$: $Eu^{2+},Dy^{3+}$ | 15%$Sr_3SiO_5$: $Eu^{2+},Dy^{3+}$ + 15%$Ca_2MgSi_2O_7$: $Eu^{2+},Dy^{3+}$ + 20%$Y_3Al_5O_{12}$: Ce |

The preparation method is as follows: 500-mesh-screening luminescence materials A and B, uniformity mixing the luminescence materials A and B in the ratios described in Examples 1-18, and packing them with an LED chip having the power of 0.1 W, so as to form a white LED lighting device with its basic unit as shown in FIG. 1, and the pulse current has a frequency of 100 Hz.

TEST EXAMPLE 1

Luminescence Characteristics of the LED Lighting Device of the Present Invention The pulse current used in the present invention has a frequency of 100 Hz, i.e., the cycle is 10 ms. Table 2 gives the brightness within 20 ms tested by the lighting device shown as the module in FIG. 1 with a high-speed camera shooting 300 photos per second, when the LED chips given in Examples 1-18 are directly powered by the AC mains supply. The reference sample is an LED lighting device driven by a pulse current formed in the same manner with a white LED chip having the commercially available blue chip packed with the yellow luminescence material. The brightness data in Table 2 is the relative test brightness of the instrument and has no dimension.

TABLE 2

| | Time | | | | | |
|---|---|---|---|---|---|---|
| | 3.33 ms | 6.66 ms | 9.99 ms | 13.32 ms | 16.65 ms | 19.98 ms |
| Brightness of Reference sample | 3565 | 3466 | 69 | 3253 | 3570 | 81 |
| Brightness of example 1 | 3436 | 3425 | 1835 | 3487 | 3500 | 1916 |
| Example 2 | 3160 | 3230 | 1760 | 2980 | 3123 | 1783 |
| Example 3 | 2786 | 2963 | 1600 | 2935 | 2963 | 1562 |
| Example 4 | 2790 | 2900 | 1652 | 2723 | 2845 | 1593 |
| Example 5 | 2543 | 2669 | 1512 | 2711 | 2814 | 1612 |
| Example 6 | 2621 | 2736 | 1650 | 2789 | 2698 | 1701 |

TABLE 2-continued

| | Time | | | | | |
|---|---|---|---|---|---|---|
| | 3.33 ms | 6.66 ms | 9.99 ms | 13.32 ms | 16.65 ms | 19.98 ms |
| Example 7 | 2317 | 2423 | 1502 | 2504 | 2642 | 1490 |
| Example 8 | 2793 | 2851 | 1711 | 2860 | 2894 | 1723 |
| Example 9 | 2714 | 2802 | 1250 | 2732 | 2800 | 1196 |
| Example 10 | 2316 | 2631 | 1436 | 2403 | 2532 | 1399 |
| Example 11 | 2588 | 2723 | 1563 | 2711 | 2733 | 1600 |
| Example 12 | 2222 | 2434 | 1436 | 2412 | 2436 | 1283 |
| Example 13 | 2633 | 2749 | 1504 | 2737 | 2765 | 1490 |
| Example 14 | 2763 | 2810 | 1477 | 2677 | 2714 | 1511 |
| Example 15 | 2454 | 2671 | 1512 | 2555 | 2545 | 1563 |
| Example 16 | 2637 | 2697 | 1400 | 2710 | 2721 | 1507 |
| Example 17 | 2332 | 2431 | 1365 | 2412 | 2455 | 1400 |
| Example 18 | 2679 | 2788 | 1566 | 2757 | 2800 | 1571 |

As can be seen from the data in Table 2, the luminescence of the present invention is stable during the pulse current cycle, while the luminescence of the white LED lighting device using the commercially available blue chip packed with the conventional yellow YAG luminescence material having no afterglow is unstable, and fluctuates very obviously during the pulse current cycle.

TEST EXAMPLE 2

Light Attenuation of the LED Lighting Device of the Present Invention

Table 3 shows the light attenuation data of Examples 1-18 and the reference sample. The reference sample is a lighting device formed by installing the white LED chip having the commercially available blue chip packed with the yellow luminescence material in the general direct current (DC) power supply mode at present. The test method is as follows: powering on the LED lighting devices driven by the pulse current of Examples 1-18 and the reference sample, and testing their brightness at a certain interval. The results are shown in Table 3, wherein the data is relative brightness and normalized with the initial data.

TABLE 3

| Time | 1 h | 1000 h | 1500 h | 2500 h |
|---|---|---|---|---|
| Brightness of Reference sample | 100 | 98 | 97 | 94 |
| Brightness of example 1 | 100 | 99.8 | 99.3 | 99.2 |
| Example 2 | 100 | 99.5 | 99.2 | 99 |
| Example 3 | 100 | 99.5 | 99 | 98 |
| Example 4 | 100 | 99.7 | 99.3 | 99 |
| Example 5 | 100 | 99.8 | 99.4 | 98.6 |
| Example 6 | 100 | 99.5 | 99 | 98 |
| Example 7 | 100 | 99.4 | 99 | 98.3 |
| Example 8 | 100 | 99.7 | 99.2 | 99 |
| Example 9 | 100 | 99.5 | 99 | 98 |
| Example 10 | 100 | 99.6 | 99 | 98.6 |
| Example 11 | 100 | 99.5 | 99 | 98 |
| Example 12 | 100 | 99.3 | 99 | 98.2 |
| Example 13 | 100 | 99.5 | 99 | 98 |
| Example 14 | 100 | 99.6 | 99.1 | 98 |
| Example 15 | 100 | 99.5 | 99 | 98 |
| Example 16 | 100 | 99.8 | 99.2 | 99 |
| Example 17 | 100 | 99.4 | 99.1 | 98.5 |
| Example 18 | 100 | 99.5 | 99.3 | 98.4 |

As can be seen from the data in Table 3, the brightness attenuation of the white LED lighting device driven by the pulse current of the present invention is less than that of the LED lighting device using the existing mode.

The data of Tables 2-3 indicates that the white LED lighting device driven by the pulse current prepared with the afterglow luminescence materials in the present invention is advantageous in stable luminescence and small light attenuation, thereby having obvious novelty and inventiveness over the existing LED lighting device.

What is claimed is:

1. A method for making a white LED lighting device, comprising:
   mixing a blue afterglow luminescence material A with a yellow luminescence material B to form a mixture, wherein the yellow luminescence material B is able to emit light under excitation of the blue afterglow luminescence material A and/or a blue, violet or ultraviolet LED chip;
   packing the mixture with at least one blue, violet or ultraviolet LED chip to form the white LED lighting device.

2. The method of claim 1, wherein the blue afterglow luminescence material A and the yellow luminescence material B are mixed at a weight ratio (A:B) of 10~70 wt %:30~90 wt %.

3. The method of claim 1, wherein the blue afterglow luminescence material A and the yellow luminescence material B are mixed at a weight ratio (A:B) of 20~50 wt %:50~80 wt %.

4. The method of claim 1, wherein the blue afterglow luminescence material A and the yellow luminescence material B are mixed at a weight ratio (A:B) of 35~50 wt %:50~65 wt %.

5. The method of claim 1, wherein the blue afterglow luminescence material A has a peak light-emitting wavelength of 440~490 nm.

6. The method of claim 1, wherein the yellow luminescence material B has a peak light-emitting wavelength of 520~580 nm.

7. The method of claim 1, wherein the blue afterglow luminescence material A comprises one or more materials selected from the group consisting of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

8. The method of claim 1, wherein the yellow luminescence material B comprises one or more materials selected from the group consisting of $Y_2O_3.Al_2O_3.SiO_2$: Ce.B.Na.P, $Y_3Al_5O_{12}$:Ce, $Tb_3Al_5O_{12}$:Ce, $Y_2O_2S$:Mg,Ti, $Sr_3SiO_5:Eu^{2+}$, $Dy^{3+}$, $Ca_2MgSi_2O_7:Eu^{2+},Dy^{3+}$, $CaS:Sm^{3+}$, YAG:Ce and TAG: Ce.

9. The method of claim 1, wherein the yellow luminescence material B is a yellow luminescence material with or without an afterglow phenomenon, or a combination thereof.

10. The method of claim 1, wherein the blue afterglow luminescence material A comprises one or more materials selected from the group consisting of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$, and wherein the yellow luminescence material B comprises one or more materials selected from the group consisting of $Y_2O_3.Al_2O_3.SiO_2$: Ce.B.Na.P, $Y_3Al_5O_{12}$:Ce, $Tb_3Al_5O_{12}$:Ce, $Y_2O_2S$:Mg,Ti, $Sr_3SiO_5:Eu^{2+},Dy^{3+}$, $Ca_2MgSi_2O_7:Eu^{2+},Dy^{3+}$, $CaS:Sm^{3+}$, YAG: Ce and TAG: Ce.

11. A method for making a white LED lighting device, comprising:
   mixing a blue afterglow luminescence material A with a yellow luminescence material B to form a mixture, wherein the yellow luminescence material B is able to emit light under excitation of the blue afterglow luminescence material A and/or a blue, violet or ultraviolet LED chip; and
   coating a lighting device with the mixture, wherein the lighting device comprises at least one blue, violet or ultraviolet LED chip.

12. The method of claim 11, wherein the blue afterglow luminescence material A and the yellow luminescence material B are mixed at a weight ratio (A:B) of 10~70 wt %:30~90 wt %.

13. The method of claim 11, wherein the blue afterglow luminescence material A and the yellow luminescence material B are mixed at a weight ratio (A:B) of 20~50 wt %:50~80 wt %.

14. The method of claim 11, wherein the blue afterglow luminescence material A and the yellow luminescence material B are mixed at a weight ratio (A:B) of 35~50 wt %:50~65 wt %.

15. The method of claim 11, wherein the blue afterglow luminescence material A has a peak light-emitting wavelength of 440~490 nm.

16. The method of claim 11, wherein the yellow luminescence material B has a peak light-emitting wavelength of 520~580 nm.

17. The method of claim 11, wherein the blue afterglow luminescence material A comprises one or more materials selected from the group consisting of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

18. The method of claim 11, wherein the yellow luminescence material B comprises one or more materials selected from the group consisting of $Y_2O_3.Al_2O_3.SiO_2$:Ce.B.Na.P, $Y_3Al_5O_{12}$:Ce, $Tb_3Al_5O_{12}$:Ce, $Y_2O_2S$:Mg,Ti, $Sr_3SiO_5:Eu^{2+}$, $Dy^{3+}$, $Ca_2MgSi_2O_7:Eu^{2+},Dy^3$, $CaS:Sm^{3+}$, YAG:Ce and TAG: Ce.

19. The method of claim 11, wherein the yellow luminescence material B is a yellow luminescence material with or without an afterglow phenomenon, or a combination thereof.

20. The method of claim 11, wherein the blue afterglow luminescence material A comprises one or more materials selected from the group consisting of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$, and wherein the yellow luminescence material B comprises one or more materials selected from the group consisting of $Y_2O_3.Al_2O_3.SiO_2$: Ce.B.Na.P, $Y_3Al_5O_{12}$:Ce, $Tb_3Al_5O_{12}$:Ce, $Y_2O_2S$:Mg,Ti, $Sr_3SiO_5$:$Eu^{2+}$,$Dy^{3+}$, $Ca_2MgSi_2O_7$:$Eu^{2+}$,$Dy^{3+}$, CaS:$Sm^{3+}$, YAG:Ce and TAG: Ce.

* * * * *